US012698238B2

(12) United States Patent (10) Patent No.: US 12,698,238 B2
Hotta et al. (45) Date of Patent: Aug. 4, 2026

(54) ALUMINA-BASED SINTERED BODY AND ELECTROSTATIC CHUCK

(71) Applicant: Niterra Co., Ltd., Nagoya (JP)

(72) Inventors: Motoki Hotta, Nagoya (JP); Takayuki Matsuoka, Nagoya (JP); Takamichi Ogawa, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 202 days.

(21) Appl. No.: 18/699,549

(22) PCT Filed: Oct. 13, 2022

(86) PCT No.: PCT/JP2022/038222
§ 371 (c)(1),
(2) Date: Apr. 8, 2024

(87) PCT Pub. No.: WO2023/068159
PCT Pub. Date: Apr. 27, 2023

(65) Prior Publication Data
US 2024/0409468 A1 Dec. 12, 2024

(30) Foreign Application Priority Data

Oct. 18, 2021 (JP) ................................. 2021-170196

(51) Int. Cl.
*H01T 23/00* (2006.01)
*C04B 35/117* (2006.01)
*H10P 72/72* (2026.01)
(52) U.S. Cl.
CPC .......... *C04B 35/117* (2013.01); *H10P 72/722* (2026.01); *C04B 2235/3206* (2013.01);
(Continued)

(58) Field of Classification Search
CPC ..................................................... C04B 35/117
See application file for complete search history.

(56) References Cited

U.S. PATENT DOCUMENTS 6,814,917 B1 11/2004 Watanabe et al.
9,630,380 B2 4/2017 Nobori et al.
(Continued)

FOREIGN PATENT DOCUMENTS

CN 1793009 A 6/2006
JP 1987-143866 A 6/1987
(Continued)

OTHER PUBLICATIONS

English translation of the Submission of Publications of the corresponding Japanese Application No. JP 2023-554621 dated Dec. 9, 2024 (see original Submission of Publications submitted via IDS dated Jul. 21, 2025).
(Continued)

*Primary Examiner* — Stephen W Jackson
(74) *Attorney, Agent, or Firm* — Stites & Harbison, PLLC; Jeffrey A. Haeberlin; Collin M. Aycock

(57) ABSTRACT

In an alumina-based sintered body containing alumina ($Al_2O_3$) as a main component and containing magnesia (MgO) whose content with respect to a content of the alumina is 0.00 mol %<MgO≤0.20 mol %, a density is 3.96 $g/cm^3$ or greater, and a standard deviation of grain sizes of alumina crystal grains is smaller than 4.0 μm.

10 Claims, 6 Drawing Sheets

(52) U.S. Cl.

CPC .. *C04B 2235/3217* (2013.01); *C04B 2235/77* (2013.01); *C04B 2235/786* (2013.01); *C04B 2235/85* (2013.01); *C04B 2235/963* (2013.01); *C04B 2235/9669* (2013.01)

(56) References Cited

U.S. PATENT DOCUMENTS

| | | | |
|---|---|---|---|
| 2006/0115685 A1 | 6/2006 | Nakasuga et al. | |
| 2008/0037194 A1 | 2/2008 | Kamitani et al. | |
| 2009/0159007 A1 | 6/2009 | Morooka | |
| 2010/0175655 A1 | 7/2010 | Lykowski et al. | |
| 2017/0243778 A1 | 8/2017 | Kouno et al. | |
| 2020/0407279 A1 | 12/2020 | Atsuji et al. | |
| 2021/0101838 A1* | 4/2021 | Ito | A61K 6/17 |

FOREIGN PATENT DOCUMENTS

| | | | |
|---|---|---|---|
| JP | 1993-008140 A | 1/1993 | |
| JP | 2000-044330 A | 2/2000 | |
| JP | 2000-178066 A | 6/2000 | |
| JP | 2001-002466 A | 1/2001 | |
| JP | 2003-95730 A | 4/2003 | |
| JP | 2003-163425 A | 6/2003 | |
| JP | 2004-284877 A | 10/2004 | |
| JP | 2006-013257 A | 1/2006 | |
| JP | 2007-258607 A | 10/2007 | |
| JP | 2009-141344 A | 6/2009 | |
| JP | 2012-515420 A | 7/2012 | |
| JP | 6373212 B2 | 8/2018 | |
| JP | 2019-069889 A | 5/2019 | |
| JP | 2020-129632 A | 8/2020 | |
| TW | 201942089 A | 11/2019 | |
| WO | 2011/021484 A1 | 2/2011 | |
| WO | 2016/052115 A1 | 4/2016 | |
| WO | 2019/188148 A1 | 10/2019 | |

OTHER PUBLICATIONS

English translation of the Submission of Publications of the corresponding Japanese Application No. JP 2023-554621 dated Mar. 12, 2025 (see original Submission of Publications submitted via IDS dated Jul. 21, 2025).

Taiwan Intellectual Property Office, Office Action (Notification for the Opinion of Examination) issued in corresponding Application No. 111139215 issued May 2, 2024.

The Submission of Publications of corresponding Application No. JP 2023-554621 dated Dec. 9, 2024 (translation not available).

The Submission of Publications of corresponding Application No. JP 2023-554621 dated Mar. 12, 2025 (translation not available).

Kingery, W.D., et al. "Introduction to Ceramics," Uchida Rokakuho Publishing Co., Ltd. (translation not available).

Japan Patent Office, Office Action (Notice of Reasons for Refusal) issued in corresponding Application No. 2023-554621, dated May 20, 2024.

The State Intellectual Property Office of People's Republic of China, The First Office Action issued in corresponding Application No. 202280066669.3 issued Oct. 9, 2025.

The State Intellectual Property Office of People's Republic of China, Notification of Information Submission issued in corresponding Application No. 202280066669.3 dated Dec. 11, 2024.

The State Intellectual Property Office of People's Republic of China, Notification of Information Submission issued in corresponding Application No. 202280066669.3 dated Mar. 20, 2025.

The State Intellectual Property Office of People's Republic of China, The Second Office Action issued in corresponding Application No. 202280066669.3 dated Apr. 1, 2026.

Japan Patent Office, International Search Report issued in corresponding Application No. PCT/JP2022/038222 mailed Dec. 27, 2022.

Taiwan Intellectual Property Office, Office Action issued in corresponding Application No. 111139215 dated Oct. 4, 2023 (English translation not available).

* cited by examiner

Fig. 6

Z (LAMINATION DIRECTION)

Y ⊙ ⟶ X

20

23

27    25    26

21

22

24

ALUMINA-BASED SINTERED BODY AND ELECTROSTATIC CHUCK

TECHNICAL FIELD

The present invention relates to an alumina-based sintered body and an electrostatic chuck.

BACKGROUND ART

In the field of semiconductor devices, in particular, flash memories, a semiconductor device (e.g., 3D-NAND) having a great aspect ratio has been required in recent years. For manufacturing such a semiconductor device having a great aspect ratio, it is necessary to etch a silicon wafer deeply, and as technology needed therefor, an electrostatic chuck to which high power can be applied is desired. An electrostatic-chuck member for high-power application is required to have a dense structure with as few pores (voids) as possible, and a dielectric strength that withstands a high electric field.

In general, ceramic containing alumina (Al$_2$O$_3$) as a main component is likely to undergo abnormal grain growth during firing, and is likely to produce a pore (void) near an abnormally grown crystal grain. In this regard, technology for improving a dielectric strength by adding magnesia (MgO) as a grain growth inhibitor is proposed (see, for example, Patent Document 1). In addition, technology for improving the density of an alumina-based sintered body by adjusting the contents of components other than alumina (Al$_2$O$_3$) in the alumina-based sintered body is proposed (see, for example, Patent Document 2).

PRIOR ART DOCUMENT

Patent Document

Patent Document 1: Japanese Patent No. 6373212
Patent Document 2: Japanese Patent Application Laid-Open (kokai) No. 2019-69889

SUMMARY OF THE INVENTION

Problem to be Solved by the Invention

However, even the alumina-based sintered body described in Patent Document 1 might not have a sufficient dielectric strength for high-power application. Therefore, the alumina-based sintered body is desired to be further increased in dielectric strength. Meanwhile, Patent Document 2 has description about the density of the alumina-based sintered body but has no mention about the number and positions of pores. Such problems are not only for electrostatic-chuck members but are seen in common among alumina-based sintered bodies used for various semiconductor-manufacturing-apparatus members.

The present invention has been made to solve the above problems, and an object of the present invention is to provide technology for improving the dielectric strength of an alumina-based sintered body and provide technology for decreasing the number of pores (voids) in an alumina-based sintered body.

Means for Solving the Problem

The present invention has been made to solve at least one of the above problems and can be implemented as the following aspects.

(1) One aspect of the present invention provides an alumina-based sintered body containing alumina (Al$_2$O$_3$) as a main component and containing magnesia (MgO) whose content with respect to a content of the alumina is 0.00 mol %<MgO≤0.20 mol %. In the alumina-based sintered body, a density is 3.96 g/cm$^3$ or greater, and a standard deviation of grain sizes of alumina crystal grains is smaller than 4.0 μm.

According to the alumina-based sintered body of the above aspect, since the standard deviation of grain sizes of alumina crystal grains is smaller than 4.0 μm, variation among grain sizes is small and the presence ratio of abnormal grains of alumina is small. Thus, the number of voids (pores) can be decreased as compared to an alumina-based sintered body which has the same density and in which the standard deviation of grain sizes of alumina crystal grains is 4.0 μm or greater. That is, in the alumina-based sintered body of the above aspect, the density is great and the number of pores is small, and therefore the denseness can be improved. In addition, since the number of pores is decreased, the dielectric strength can be improved.

(2) In the alumina-based sintered body of the above aspect, a presence quantity of voids may be 0.050 pieces/μm$^2$ or less. Thus, the alumina-based sintered body having a high dielectric strength can be obtained.

(3) In the alumina-based sintered body of the above aspect, when the voids are divided into first voids which are voids present at crystal grain boundaries and second voids which are voids present in crystal grains, a ratio of a presence quantity of the second voids to the presence quantity of the voids may be 20% or greater. Using the alumina-based sintered body in which the presence quantity of voids present at crystal grain boundaries is decreased as described above can inhibit a leakage current flowing through crystal grain boundaries when an electric field is applied, whereby the dielectric strength can be improved.

(4) In the alumina-based sintered body of the above aspect, a dielectric breakdown voltage may be 200 kV/mm or greater. Thus, a high dielectric strength can be obtained, and therefore the alumina-based sintered body can be used for an electrostatic chuck to which high power can be applied, for example.

(5) In the alumina-based sintered body of the above aspect, a surface roughness Sa of a surface irradiated with plasma for 40 minutes may be 50 nm or smaller. Thus, the alumina-based sintered body having high plasma resistance can be obtained. Using the alumina-based sintered body having high plasma resistance for, for example, an electrostatic chuck, can suppress reduction in gas sealing performance and chuck force of a wafer placement surface.

(6) Another aspect of the present invention provides an electrostatic chuck at which a target object is retained. This electrostatic chuck includes: a plate-shaped member having a first surface at which the target object is retained, a second surface opposite to the first surface, and a chuck electrode formed either at the second surface or inside the plate-shaped member; and a base member provided on the second surface side of the plate-shaped member and having a cooling function. The first surface of the plate-shaped member is formed of the alumina-based sintered body of the above aspect.

According to the electrostatic chuck of the above aspect, since the first surface of the plate-shaped member is formed of the alumina-based sintered body having few pores and a high dielectric strength, the electrostatic chuck to which high power can be applied can be provided.

(7) In the electrostatic chuck of the above aspect, the plate-shaped member may have a gas flow path which has an opening at the first surface and into which gas is introduced from the second surface side, and a seal band portion continuously formed on the first surface along an outer edge of the plate-shaped member, and the opening of the gas flow path may be formed on an inner side relative to the seal band portion. Thus, it is possible to improve sealing performance for gas (e.g., helium (He) gas) flowing through the gas flow path and discharged between the target object and the first surface of the plate-shaped member.

(8) Another aspect of the present invention provides an alumina-based sintered body containing alumina ($Al_2O_3$) as a main component. In this alumina-based sintered body, a presence quantity of voids may be 0.050 pieces/$\mu m^2$ or less, and when the voids are divided into first voids which are voids present at crystal grain boundaries and second voids which are voids present in crystal grains, a ratio of a presence quantity of the second voids to the presence quantity of the voids may be 20% or greater. Also in this case, the number of voids (pores) can be decreased, whereby the dielectric strength can be improved.

The present invention can be implemented in various aspects. For example, the present invention can be implemented in aspects such as a semiconductor-manufacturing-apparatus member, a semiconductor manufacturing apparatus, a retention apparatus, an electrostatic chuck, an apparatus including the above-described one(s), or a manufacturing method for a semiconductor-manufacturing-apparatus member.

BRIEF DESCRIPTION OF THE DRAWINGS

FIG. 6 Enlarged schematic view of a cross-section along line A-A in FIG. 5.

MODES FOR CARRYING OUT THE INVENTION

First Embodiment

Figure 1:
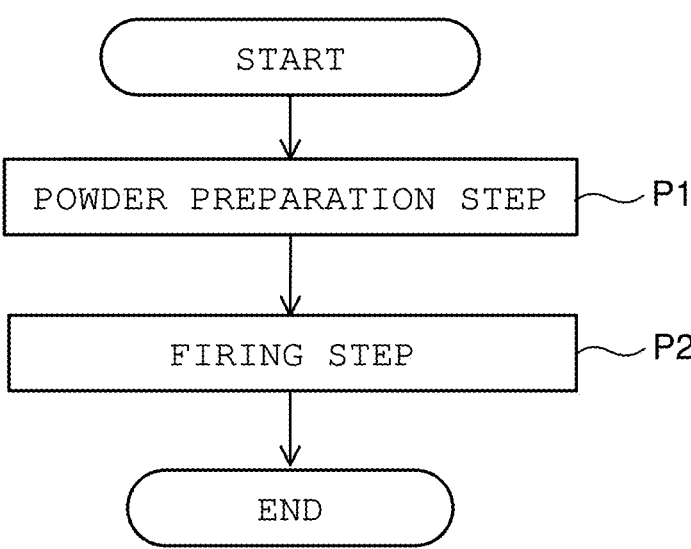
FIG. 1 Flowchart showing a manufacturing method for an alumina-based sintered body.

An alumina-based sintered body according to a first embodiment of the present invention is an alumina-based sintered body containing alumina ($Al_2O_3$) as a main component and containing magnesia (MgO) whose content with respect to a content of the alumina is 0.00 mol %<MgO≤0.20 mol %. In the alumina-based sintered body, a density is 3.96 g/cm$^3$ or greater and a standard deviation of grain sizes of alumina crystal grains is smaller than 4.0 μm. Here, the "main component" refers to a component having the greatest content ratio.

The content of magnesia can be calculated as follows. On the alumina-based sintered body, element analysis by XRF (X-ray Fluorescence) is performed, to determine the amount of magnesium (Mg). The magnesium amount obtained by analysis is converted to an oxide equivalent, thus calculating the content of magnesia. Similarly, the amount of aluminum (Al) is determined and converted to an oxide equivalent, thus calculating the content of alumina. Then, the ratio of the amount (mol) of magnesia to the amount (mol) of alumina is calculated.

In the alumina-based sintered body, adding magnesia can inhibit abnormal grain growth of alumina crystal grains.

The density of the alumina-based sintered body can be measured by the Archimedes method (JIS R 1634).

The grain sizes of alumina crystal grains in the alumina-based sintered body can be measured by the intercept method. Specifically, a fracture cross-section of the alumina-based sintered body is observed by an SEM (Scanning Electron Microscope), a line having a length L is drawn on an obtained secondary electron image, and then a number n of grains crossed by the line is measured. Here, a grain in which each end of the line is present is counted as 0.5. Then, an average grain size D (μm) is calculated by the following Expression (1).

$$D = 1.5 \times L/n \tag{1}$$

In the present embodiment, an arbitrary number of lines each intersecting grains whose number n is 100 or more are drawn in parallel, to calculate a plurality of average grain sizes D, and then a standard deviation is calculated using the plurality of calculated average grain sizes.

Preferably, in the alumina-based sintered body of the present embodiment, a presence quantity of voids (pores) is 0.050 pieces/$\mu m^2$ or less. Decreasing the number of pores can improve the dielectric strength. In addition, since the number of pores is small, the number of start points of plasma erosion is decreased, whereby plasma resistance can be improved.

The presence quantity of voids (pores) can be visually counted using a cross-section STEM (Scanning Transmission Electron Microscope) image. Also, the presence of pores can be confirmed using a fracture cross-section SEM image. On the fracture cross-section SEM image, the number of pores present at crystal grain boundaries is found but the number of pores present in crystal grains cannot be found. Thus, the total number of pores is larger than the presence quantity of pores obtained using the fracture cross-section SEM image. Therefore, preferably, the presence quantity of pores is confirmed using the cross-section STEM image if the number of pores is small on the fracture cross-section SEM image.

In the alumina-based sintered body of the present embodiment, preferably, when the voids (pores) are divided into first voids which are voids present at crystal grain boundaries and second voids which are voids present in crystal grains, a ratio of a presence quantity of the second voids to the presence quantity of the voids is 20% or greater. It is considered that a pore present at a crystal grain boundary serves as a passage for a leakage current when an electric field is applied, and thus serves as a start point of dielectric breakdown. Therefore, using the alumina-based sintered body in which the presence quantity of voids present at crystal grain boundaries is decreased can inhibit a leakage current flowing through crystal grain boundaries, whereby the dielectric strength can be further improved. The presence quantity of voids can be counted using a cross-section STEM image as described above.

In the alumina-based sintered body of the present embodiment, preferably, a dielectric breakdown voltage is 200 kV/mm or greater. Thus, a high dielectric strength can be obtained, and therefore, the alumina-based sintered body can be used for an electrostatic chuck to which high-power can be applied, for example. As the dielectric breakdown voltage, a voltage when dielectric breakdown occurs is measured in accordance with JIS C2110.

In the alumina-based sintered body of the present embodiment, a surface roughness Sa of a surface irradiated with plasma for 40 minutes may be 50 nm or smaller. Thus, the alumina-based sintered body having high plasma resistance can be obtained. Using the alumina-based sintered body having high plasma resistance for, for example, an electrostatic chuck, can suppress reduction in gas sealing performance and chuck force of a wafer placement surface.

FIG. 1 is a flowchart showing a manufacturing method for the alumina-based sintered body. In the manufacturing method for the alumina-based sintered body of the present embodiment, first, a powder preparation step in which an $Al_2O_3$ raw material and an MgO raw material in amounts measured in advance are mixed in ethanol by a ball mill and then dried, is performed (step P1). The addition amount of the MgO raw material is 0.00 mol %<MgO≤0.20 mol % with respect to the $Al_2O_3$ raw material. Next, a firing step in which the mixture powder obtained in the powder preparaareas between particles become large, a sintering process can be finished in a shorter period as compared to atmospheric firing.

With the manufacturing method of the present embodiment, it is possible to obtain an alumina-based sintered body having a smaller amount of impurities and a higher dielectric strength as compared to a case of manufacturing an alumina-based sintered body by gel casting.

The alumina-based sintered body of the present embodiment can be used for a semiconductor-manufacturing-apparatus member, a semiconductor manufacturing apparatus, a retention apparatus, an electrostatic chuck, an apparatus including the above-described one(s), and the like.

EXAMPLES

The present invention will be described more specifically, using Examples.

Using samples 1 to 9 of alumina-based sintered bodies, the dielectric strength and the plasma resistance were evaluated. The samples 1 to 5 and 8 are Examples of the alumina-based sintered body of the above embodiment, and the samples 6, 7, and 9 are alumina-based sintered bodies in Comparative Examples.

Table 1 shows the specifications and evaluation results for the samples 1 to 9. An evaluation method will be described later.

TABLE 1

| | Sample No. | Addition amount of MgO mol % | Sintered body density g/cm$^3$ | Standard deviation of grain sizes μm | Number of pores pieces/μm$^2$ | Presence ratio of pores % | Dielectric strength kV/mm | Plasma resistance nm |
|---|---|---|---|---|---|---|---|---|
| Ex. | 1 | 0.10 | 3.98 | 1.7 | 0.042 | 37 | 188 | 35 |
| Ex. | 2 | 0.10 | 3.97 | 1.4 | 0.009 | 25 | 234 | 31 |
| Ex. | 3 | 0.10 | 3.99 | 2.4 | 0.006 | 100 | 297 | 14 |
| Ex. | 4 | 0.20 | 3.98 | 2.0 | 0.029 (SEM) | — | 186 | 29 |
| Ex. | 5 | 0.10 | 3.98 | 3.0 | 0.004 | 100 | 295 | 9 |
| Ex. | 8 | 0.13 | 3.97 | 0.9 | 0.025 | 73 | 214 | 35 |
| Comp. Ex. | 6 | 0.13 | 3.90 | 2.8 | 0.054 | 18 | 100 | 109 |
| Comp. Ex. | 7 | 0.10 | 3.98 | 4.0 | — | — | 145 | — |
| Comp. Ex. | 9 | 0.30 | 3.98 | 2.4 | 0.048 | — | 162 | — | tion step (step P1) is shaped and fired at a firing temperature of 1500° C. to 1700° C. by a hot-pressing machine, is performed (step P2), whereby an alumina-based sintered body is manufactured. In a case where the firing temperature is a high temperature above 1700° C., there is a high possibility that abnormal grain growth of grains occurs, so that the possibility of reduction in the dielectric strength increases. Therefore, it is desirable that the firing temperature is 1500° C. to 1700° C. The press pressure of hot pressing can be arbitrarily set. In a case where the press pressure is a low pressure below 10 MPa, particles are less compressed in hot pressing and densification is not promoted, so that air is highly likely to remain as pores at grain boundaries. Therefore, it is desirable that the press pressure is 10 MPa to 40 MPa. The content of MgO in the alumina-based sintered body can be measured by XRF or ICP optical emission spectroscopy. In hot pressing, since a pressure is applied during firing, as compared to atmospheric firing, firing can be performed while particles are compressed, so that densification can be promoted and pores at grain boundaries are readily decreased. In addition, since the contact

1. Manufacturing of Samples

The samples 1 to 5 and 8 were manufactured by the manufacturing method of the above embodiment. The sample 6 was manufactured in the same manner as in the manufacturing method of the above embodiment except that firing was performed at normal pressure without performing hot pressing. The sample 7 was manufactured in the same manner as in the manufacturing method of the above embodiment except that hot pressing was performed at a temperature above 1700° C. The sample 9 was obtained by performing HIP (Hot Isostatic Pressing) on the normal-pressure-fired sample 6 at a pressure of 200 MPa or lower. Also by performing HIP, it is possible to decrease the number of pores, in particular, grain-boundary pores, and thus improve the dielectric strength.

In the samples 1 to 9, the alumina raw material having a purity of 99.9% or higher was used.

The magnesia raw material was added at a ratio shown in Table 1 with respect to the alumina raw material. Specifically, the magnesia raw material was added at 0.10 mol % in the samples 1 to 3, 5, and 7, 0.20 mol % in the sample 4, 0.13 mol % in the samples 6 and 8, and 0.3 mol % in the sample 9. Magnesia can inhibit abnormal grain growth of alumina crystal grains as described later.

In the samples 1 to 5 and 7, yttria (yttrium oxide: $Y_2O_3$) was added at a predetermined ratio (0 to 0.05 mol %) with respect to the alumina raw material. If the addition amount of yttria is greater than 0.05 mol %, yttria is likely to undergo segregation as a secondary phase. When segregation of the secondary phase occurs, the possibility of causing reduction in the dielectric strength increases. Therefore, the addition amount of yttria is favorably 0 to 0.05 mol %. In the samples 6, 8, and 9, yttria was not added. Yttria was added as a sintering additive.

In each of these samples, the addition amount of the sintering additive is as little as 0 to 0.05 mol % and the addition amount of magnesia substantially coincides with the content of magnesia in the alumina-based sintered body.

By differently setting the addition amount of magnesia, the addition amount of yttria, the firing method (hot pressing or normal pressure), the firing atmosphere (argon (Ar), atmospheric air, or vacuum), and the firing temperature, the samples 1 to 9 were made different from each other in the density of the alumina-based sintered body, the standard deviation of grain sizes, the number of pores (voids), and the ratio of pores (voids) present at crystal grain boundaries. The samples 1 to 9 did not contain impurities other than magnesia and yttria. Here, the wording "not contain impurities" means that "the amount of process impurities such as Si, Ca, and Fe is 10 ppm or smaller".

The density of each alumina-based sintered body was measured by Archimedes method (JIS R 1634).

The standard deviation of grain sizes of alumina crystal grains in each alumina-based sintered body was calculated using grain sizes measured by the intercept method as described above.

The number of pores and the presence ratio of pores were obtained using a cross-section STEM image (magnification: 5000×) as described above. Specifically, images were taken in three or more viewing ranges each including four or more pores, and the average of the numbers of pores was used as the presence quantity of pores. For the sample 4, confirmation using a cross-section STEM image was not performed and therefore the number of pores obtained using a fracture cross-section SEM is shown as a reference. The presence ratio of pores in Table 1 is the ratio of the number of pores present in crystal grains to the total number of pores which is the sum of the number of pores present at crystal grain boundaries and the number of pores present in crystal grains.

Figure 2A:
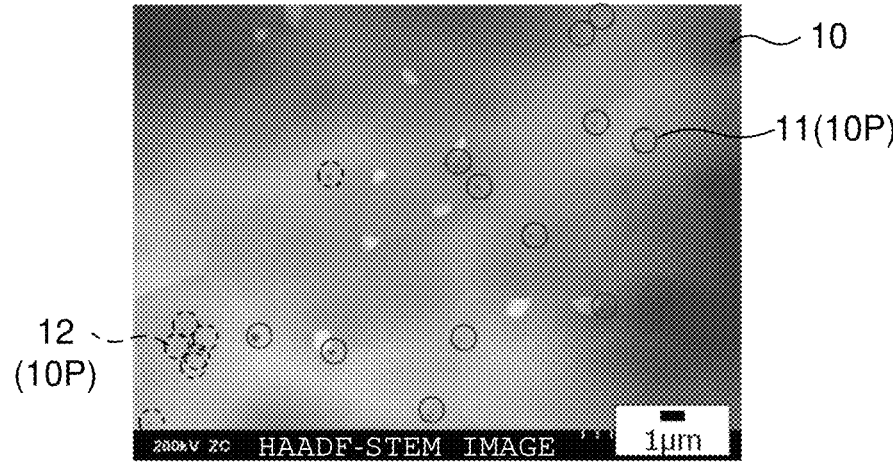
FIG. 2A View showing an examples of cross-section STEM images of sample 1.
Figure 2B:
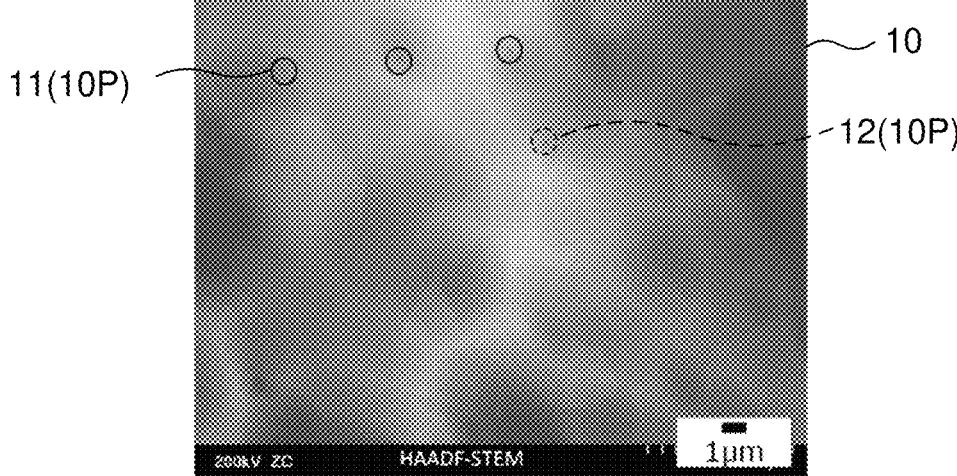
FIG. 2B View showing an examples of cross-section STEM images of sample 2.
Figure 2C:
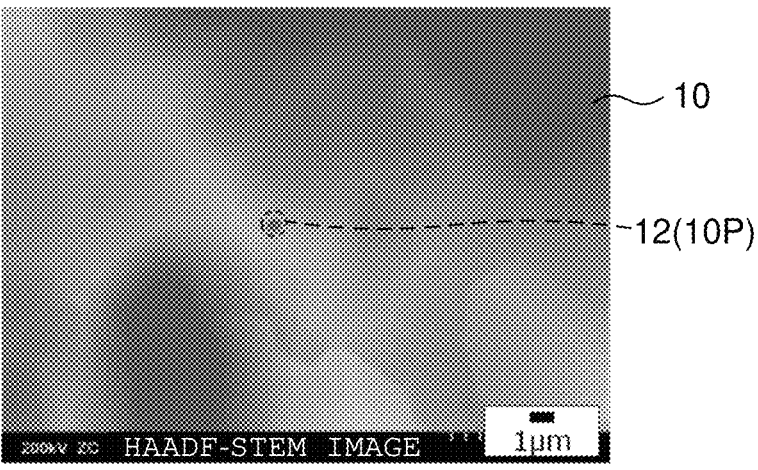
FIG. 2C View showing an examples of cross-section STEM images of sample 3.
Figure 3D:
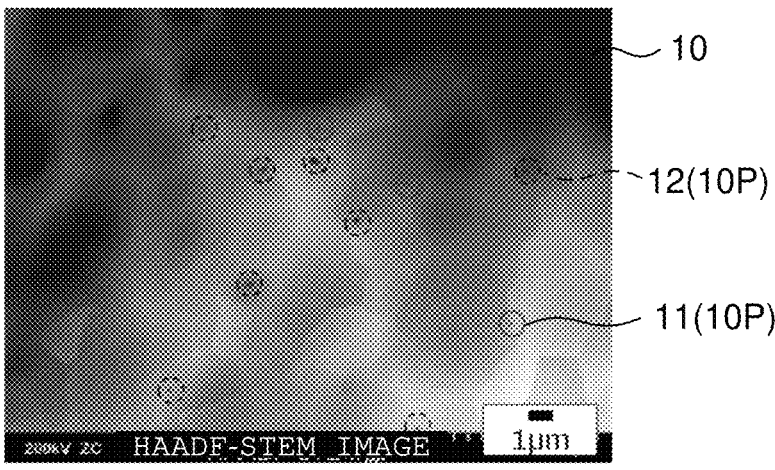
FIG. 3D View showing an example of a cross-section STEM image of a sample 8.

FIG. 2A to 2C and FIG. 3 show examples of cross-section STEM images of alumina-based sintered bodies 10 in the samples 1 to 3. FIG. 2A shows the sample 1, FIG. 2B shows the sample 2, and FIG. 2C shows the sample 3, and FIG. 3D shows a STEM image of the sample 8 (magnification: 5000×). In FIG. 2A to 2C, of pores (voids 10P) present in the alumina-based sintered body 10, pores (first voids 11) present at crystal grain boundaries are enclosed by solid lines, and pores (second voids 12) present in crystal grains are enclosed by broken lines.

2. Evaluation Method (1) Dielectric Strength

The dielectric strength was evaluated using a dielectric breakdown voltage. The higher the dielectric breakdown voltage is, the greater the dielectric strength is. The dielectric breakdown voltage was obtained as follows. From each of the samples 1 to 9, a test piece having a rectangular plate shape of which the length of one side was 20 mm and the thickness was 0.15 mm, was prepared, and a voltage when dielectric breakdown occurred was measured in accordance with JIS C2110. An average value obtained by measuring the voltage four times is shown in Table 1.

(2) Plasma Resistance

Each sample was irradiated with plasma, and the surface roughness Sa of the surface irradiated with plasma was measured. The surface roughness Sa was measured by an apparatus conforming to the standard of ISO25178. This apparatus measured the surface roughness Sa, using a vertical scanning low coherence interferometry.

Plasma endurance evaluation conditions were as follows.
Apparatus: NLD (Neutral Loop Discharge) Plasma Apparatus
Antenna RF power: 1 kW
Bias: 0.3 kW
$CF_4$=90 sccm, $O_2$=10 sccm
Exposure time: 40 minutes

3. Evaluation Result

The alumina-based sintered bodies in the samples 1 to 5 and 8 (Examples) satisfy all requirements [1] to [5] below.

[1] The content of magnesia (MgO) is 0.00 mol %<MgO≤ 0.20 mol %.

[2] The density is 3.96 g/cm³ or greater.

[3] The standard deviation of grain sizes of alumina crystal grains is smaller than 4.0 μm.

[4] The presence quantity of voids is 0.050 pieces/μm² or less.

[5] When voids are divided into first voids which are voids present at crystal grain boundaries and second voids which are voids present in crystal grains, the ratio of the presence quantity of the second voids to the presence quantity of the voids is 20% or greater.

On the other hand, the sample 6 (Comparative Example) satisfies the above requirements [1] and [3] but does not satisfy the above requirements [2], [4], and [5]. That is, in the sample 6 (Comparative Example), the density is low, the number of pores is large, and the ratio of pores present at crystal grain boundaries is great, as compared to Examples. In addition, the sample 7 (Comparative Example) satisfies the above requirements [1] and [2] but does not satisfy the above requirement [3]. In the sample 7 (Comparative Example), the density is equivalent to those in Examples, but as compared to Examples, the standard deviation of alumina crystal grains is great, and therefore it is considered that there is great variation among grain sizes, the presence ratio of abnormal grains of alumina is great, and the number of pores is large. The sample 9 (Comparative Example) satisfies the above requirements [2] to [4] but does not satisfy the above requirement [1]. That is, in the sample 9 (Comparative Example), the content of magnesia (MgO) is high as compared to Examples.

In the alumina-based sintered bodies in the samples 1 to 5 and 8 (Examples), at least one of the dielectric strength and the plasma resistance is high as compared to the samples 6, 7, and 9 (Comparative Examples). In the alumina-based sintered bodies in Examples, since the number of pores is reduced, the denseness is high, and the ratio of pores present at crystal grain boundaries is reduced, a leakage current flowing through crystal grain boundaries is inhibited and thus the dielectric strength is successfully improved. In addition, in Examples, the number of pores is smaller than in Comparative Examples, so that the number of start points of plasma erosion is decreased and the surface roughness after plasma irradiation is reduced.

More detailed description will be given through comparison among the samples 1 to 5 and 8 in Examples.

In the sample 2, the number of pores is significantly reduced as compared to sample 1. Thus, in the sample 2, the dielectric strength is successfully improved as compared to sample 1.

In the sample 3, the ratio of pores present at crystal grain boundaries is significantly reduced as compared to sample 2. Thus, in the sample 3, the dielectric strength is successfully improved more than in the sample 1.

In the sample 4, magnesia is more added than in the sample 2, but the same firing condition as in the sample 2 is used. In the sample 4, the number of pores is increased and the dielectric strength is reduced, as compared to the sample 2. This is because, when the addition amount of magnesia is increased, a secondary phase of $MgAl_2O_4$ or the like becomes likely to arise. In the sample 4, the dielectric strength is reduced as compared to the sample 2 but a dielectric strength equivalent to that in the sample 1 can be obtained. In the sample 9 (Comparative Example), the addition amount of magnesia is 0.3 mol % which is large as compared to the Examples, and the dielectric strength is low. Therefore, it is appropriate that the content of magnesia (MgO) is 0.00 mol %<MgO≤0.20 mol %.

In the sample 5, the standard deviation of grain sizes is great as compared to other Examples, but the number of pores is small and there are almost no pores present at crystal grain boundaries, so that a high dielectric strength and a high plasma resistance are successfully obtained. In the sample 7 (Comparative Example), the standard deviation of grain sizes is 4.0 μm and the dielectric strength is low. Therefore, if the standard deviation of grain sizes is set to be smaller than 4.0 μm, a high plasma resistance can be obtained.

In the sample 8, the number of pores is large as compared to the sample 2, but the presence ratio of pores is great as compared to the sample 2, so that a dielectric strength and plasma resistance approximately equal to those in the sample 2 are successfully obtained. From this result, it can be said that the presence ratio of pores has a great influence on the dielectric strength. It is considered that, when a voltage is applied, a grain boundary is more likely to serve as a path for a current than a grain inside and a grain-boundary pore present on a current path is more likely to serve as a start point of dielectric breakdown than a grain-inside pore, and therefore decreasing the number of grain-boundary pores can improve the dielectric strength.

Second Embodiment

Figure 4:
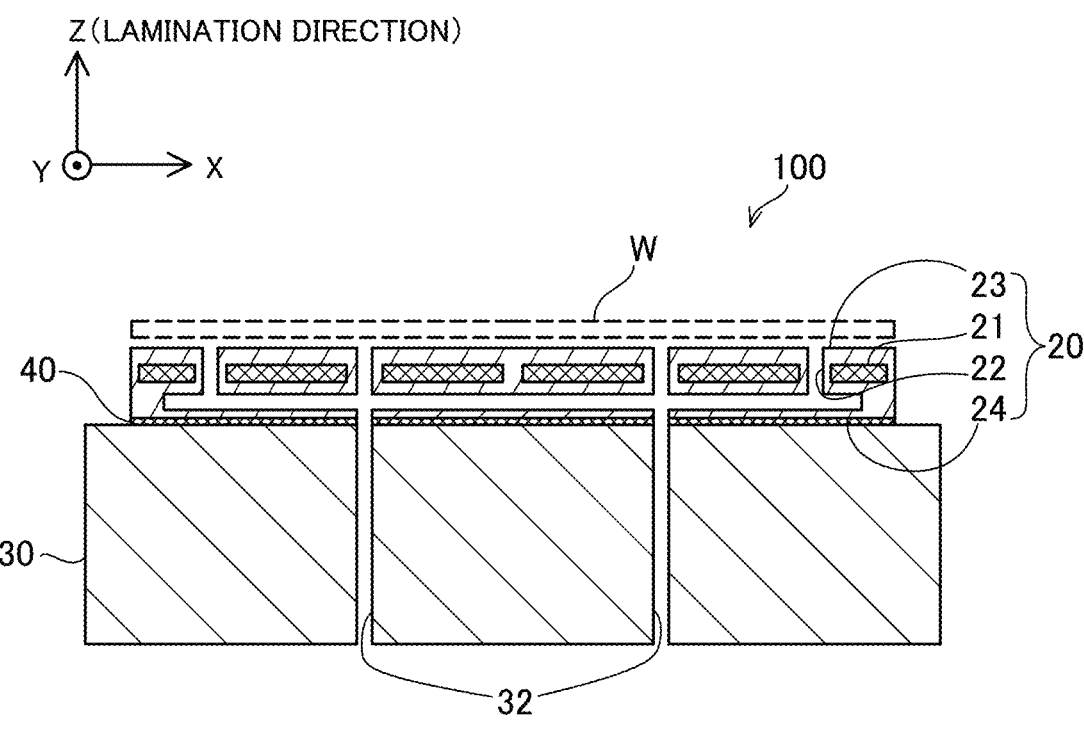
FIG. 4 Schematic sectional view of a retention apparatus.

FIG. 4 is a schematic sectional view of a retention apparatus 100 using the alumina-based sintered body 10 of the first embodiment. The retention apparatus 100 is a part of a semiconductor manufacturing apparatus that performs plasma etching, ion implantation, electron beam exposure, and the like. The retention apparatus 100 is used as an electrostatic chuck for performing fixation, flatness correction, transportation, and the like for a semiconductor wafer W (hereinafter, simply referred to as "wafer W") and cooling the wafer W. In FIG. 4, X, Y, and Z axes orthogonal to each other are shown for specifying directions. As used herein, a Z-axis positive direction is referred to as a lamination direction, for convenience sake.

In FIG. 4, the wafer W to be retained by the retention apparatus 100 is shown by a broken line. As shown in FIG. 4, the retention apparatus 100 includes a plate-shaped member 20 at which the wafer W as a target object is retained, and a base member 30 joined to the plate-shaped member 20 and having a cooling function. The plate-shaped member 20 has a first surface 23 at which the wafer W is retained, a second surface 24 opposite to the first surface 23, and chuck electrodes 21 formed inside the plate-shaped member 20. As shown in FIG. 4, the base member 30 is joined to the second surface 24 of the plate-shaped member 20 via a joining layer 40. The first surface 23 of the plate-shaped member 20 for retaining the wafer W has a seal band portion 26 and a plurality of embossed portions 27 described later, which are omitted in FIG. 4.

The plate-shaped member 20 is an alumina-based sintered body containing alumina ($Al_2O_3$) as a main component, and satisfies at least the requirements [1] to [3] described in the first embodiment. Inside the plate-shaped member 20, a plurality of the chuck electrodes 21 as conductors are buried. When a voltage is applied to the chuck electrodes 21 in a state in which the wafer W is placed at the first surface 23, electrostatic force is generated, so that the wafer W is fixed to the first surface 23.

Inside the plate-shaped member 20, gas flow paths 22 which are through holes penetrating in the lamination direction between the second surface 24 and the first surface 23 of the plate-shaped member 20, are provided. The gas flow paths 22 supply, onto the first surface 23, inert gas (e.g., helium gas) for cooling the wafer W, which is supplied from gas supply holes 32 of the base member 30 described later. As shown in FIG. 4, the gas flow paths 22 are opened on the first surface 23.

The base member 30 is formed of metal such as aluminum or stainless steel, for example. Inside the base member 30, the gas supply holes 32 are formed so as to penetrate in the lamination direction. The inert gas supplied from an apparatus such as a pump is supplied to the gas flow paths 22 of the plate-shaped member 20 via the gas supply holes 32.

Figure 5:
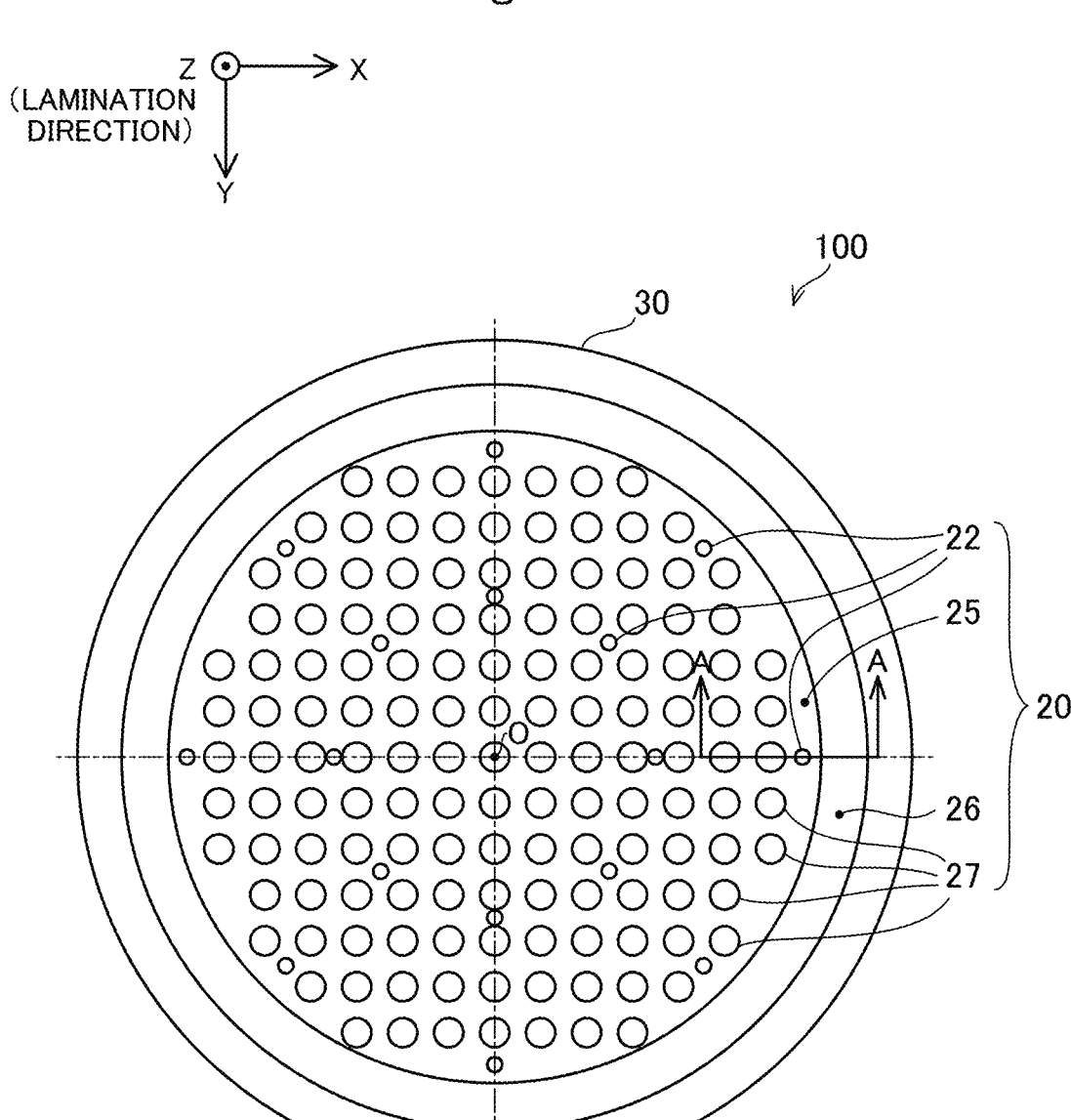
FIG. 5 Schematic top view of the retention apparatus.
Figure 6:
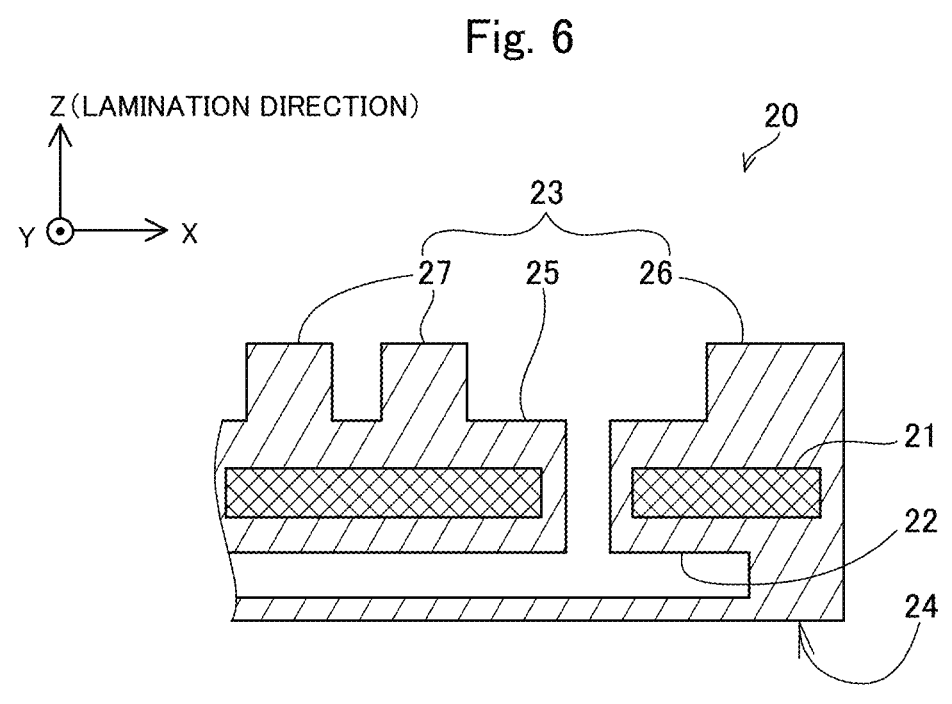

FIG. 5 is a schematic top view of the retention apparatus 100. FIG. 6 is an enlarged schematic view along line A-A in FIG. 5. As shown in FIG. 5, the plate-shaped member 20 and the base member 30 have substantially disk shapes about a center O. The first surface 23 of the plate-shaped member 20 has exits (openings) of a plurality of the gas flow paths 22. As shown in FIG. 5 and FIG. 6, the first surface 23 has a flat surface 25, the seal band portion 26 having a projecting shape and formed continuously along the outer edge of the flat surface 25, and a plurality of the embossed portions 27 having columnar shapes and protruding from the flat surface 25 on the inner side of the seal band portion 26. When retained by the plate-shaped member 20, the wafer W is attracted to the surfaces of the seal band portion 26 and the embossed portions 27.

In a case where the alumina-based sintered body 10 is used for the plate-shaped member 20, mixture powder that is a raw material for the alumina-based sintered body 10 is shaped by a preliminary press in advance. In a state in which a metal mesh or a metal foil for the chuck electrodes 21 of the plate-shaped member 20 is placed, the preliminary-pressed mixture powder is placed between press-shaped bodies, and then are fired by hot pressing. After firing, the obtained product is worked by grinding, whereby the plate-shaped member 20 having the seal band portion 26 and the embossed portions 27 is manufactured. That is, the surfaces of the seal band portion 26 and the embossed portions 27 are formed by the alumina-based sintered body 10.

As described above, the retention apparatus 100 includes the plate-shaped member 20 and the base member 30 joined to the plate-shaped member 20. The plate-shaped member 20 has the chuck electrodes 21 formed therein and the seal band portion 26 formed continuously along the outer edge of the first surface 23. A surface part at the first surface 23 for retaining the wafer W is formed by a surface part of an alumina-based sintered body containing alumina ($Al_2O_3$) as a main component and containing magnesia (MgO) whose content with respect to a content of the alumina is 0.00 mol %<MgO≤0.20 mol %. A density is 3.96 g/cm³ or greater and a standard deviation of grain sizes of alumina crystal grains is smaller than 4.0 μm. That is, since the surface part at the first surface 23 for retaining the wafer W is formed of the alumina-based sintered body having few pores and a high dielectric strength, high power can be applied. Therefore, if the retention apparatus 100 of the present embodiment is used, the wafer W can be etched deeply.

In the retention apparatus 100, the plate-shaped member 20 has the gas flow paths 22 and the seal band portion 26, and the openings of the gas flow paths 22 are formed on the inner side relative to the seal band portion 26. Thus, it is possible to improve sealing performance for gas (e.g., helium (He) gas) flowing through the gas flow paths 22 and discharged between the wafer W and the first surface 23 of the plate-shaped member 20.

Modifications of Embodiments

The present invention is not limited to the above embodiments and may be implemented in various embodiments without deviating from the gist of the present invention. For example, the following modifications are also possible.

The manufacturing method for the alumina-based sintered body is not limited to that in the above embodiment. The kind of the sintering additive, the addition amount of the sintering additive, the firing method, the firing atmosphere, the firing temperature, the hot-pressing pressure, and the like may be changed as appropriate, so as to manufacture the alumina-based sintered body in which the content of magnesia (MgO) with respect to a content of the alumina is 0.00 mol %<MgO≤0.20 mol %, the density is 3.96 g/cm³ or greater, and the standard deviation of grain sizes of alumina crystal grains is smaller than 4.0 μm. The alumina-based sintered body may be manufactured by another known method such as gel casting.

The above embodiment has exemplified the alumina-based sintered body not containing impurities other than magnesia and yttria. However, other impurities may be contained. It is noted that the alumina-based sintered body not containing other impurities can have a more improved dielectric strength and thus is preferable.

The above embodiment has exemplified the alumina-based sintered body in which the content of magnesia (MgO) with respect to a content of alumina is 0.00 mol %<MgO≤0.20 mol %, the density is 3.96 g/cm³ or greater, and the standard deviation of grain sizes of alumina crystal grains is smaller than 4.0 μm. However, the content of magnesia, the density, and the standard deviation of grain sizes of alumina crystal grains are not limited to those in the above embodiment. For example, magnesia may not be contained. In the alumina-based sintered body containing alumina ($Al_2O_3$) as a main component, the presence quantity of voids may be 0.050 pieces/μm² or less, and when the voids are divided into first voids which are voids present at crystal grain boundaries and second voids which are voids present in crystal grains, a ratio of a presence quantity of the second voids to the presence quantity of the voids is 20% or greater. Also in this case, the dielectric strength can be improved because, when a voltage is applied, a grain boundary is more likely to serve as a path for a current than a grain inside and a grain-boundary pore present on a current path is more likely to serve as a start point of dielectric breakdown than a grain-inside pore, and therefore decreasing the number of grain-boundary pores can improve the dielectric strength.

The above second embodiment has shown the example in which the plate-shaped member 20 of the retention apparatus 100 has the gas flow paths 22, the seal band portion 26, and the embossed portions 27. However, the retention apparatus may not include at least one kind of those.

In the above second embodiment, the entirety of the plate-shaped member 20 is the alumina-based sintered body 10. However, the alumina-based sintered body 10 may be applied to at least the surface part at the first surface 23 for retaining the wafer W. For example, the surface part at the first surface 23 may be formed of the alumina-based sintered body 10, and the second surface 24 may be formed of another alumina-based sintered body different from the alumina-based sintered body 10. A different member (e.g., another alumina-based sintered body different from the alumina-based sintered body 10) may be placed or joined between the plate-shaped member 20 and the base member 30.

The above embodiment has exemplified the electrostatic chuck as the retention apparatus. However, the retention apparatus is not limited to the electrostatic chuck, and may be configured as various retention apparatuses such as a heater apparatus, a susceptor, and a placement base for a vacuum apparatus for CVD (chemical vapor deposition), PVD (physical vapor deposition), PLD (Pulsed Laser Deposition), or the like.

While the present invention has been described above using the embodiments, Examples, and the modifications, the embodiments described above are merely for facilitating the understanding of the present invention and are not intended to limit the present invention. The present invention may be subjected to change or modification without deviating from the gist thereof and the scope of the claims, and the present invention includes equivalents thereof. Further, such technical features can be deleted as appropriate if not described as being essential in the present specification.

DESCRIPTION OF REFERENCE NUMERALS

10: alumina-based sintered body
10P: void
11: first void
12: second void
20: plate-shaped member
21: chuck electrode
22: gas flow path
23: first surface
24: second surface
25: flat surface
26: seal band portion
27: embossed portion
30: base member
32: gas supply hole
40: joining layer
100: retention apparatus
W: wafer

13

The invention claimed is:

1. An alumina-based sintered body containing alumina (Al$_2$O$_3$) as a main component and containing magnesia (MgO) whose content with respect to a content of the alumina is 0.00 mol % <MgO≤0.20 mol %, wherein
 a density is 3.96 g/cm$^3$ or greater, and a standard deviation of grain sizes of alumina crystal grains is smaller than 4.0 μm, a presence quantity of voids is 0.050 pieces/ μm$^2$ or less, and
 when the voids are divided into first voids which are voids present at crystal grain boundaries and second voids which are voids present in crystal grains, a ratio of a presence quantity of the second voids to the presence quantity of the voids is 20% or greater.

2. The alumina-based sintered body in accordance with claim 1, wherein a dielectric breakdown voltage is 200 kV/mm or greater.

3. The alumina-based sintered body in accordance with claim 1, wherein
 a surface roughness Sa of a surface irradiated with plasma for 40 minutes is 50 nm or smaller.

4. An electrostatic chuck at which a target object is retained, the electrostatic chuck comprising:
 a plate-shaped member having a first surface at which the target object is retained, a second surface opposite to the first surface, and a chuck electrode formed either at the second surface or inside the plate-shaped member; and
 a base member provided on the second surface side of the plate-shaped member and having a cooling function, wherein
 the first surface of the plate-shaped member is formed of the alumina-based sintered body in accordance with claim 1.

5. The electrostatic chuck in accordance with claim 4, wherein
 the plate-shaped member has
 a gas flow path which has an opening at the first surface and into which gas is introduced from the second surface side, and
 a seal band portion continuously formed on the first surface along an outer edge of the plate-shaped member, and
 the opening of the gas flow path is formed on an inner side relative to the seal band portion.

6. An alumina-based sintered body containing alumina (Al$_2$O$_3$) as a main component, wherein

14 a presence quantity of voids is 0.050 pieces/μm$^2$ or less, and
 when the voids are divided into first voids which are voids present at crystal grain boundaries and second voids which are voids present in crystal grains, a ratio of a presence quantity of the second voids to the presence quantity of the voids is 20% or greater.

7. The alumina-based sintered body in accordance with claim 2, wherein
 a surface roughness Sa of a surface irradiated with plasma for 40 minutes is 50 nm or smaller.

8. An electrostatic chuck at which a target object is retained, the electrostatic chuck comprising:
 a plate-shaped member having a first surface at which the target object is retained, a second surface opposite to the first surface, and a chuck electrode formed either at the second surface or inside the plate-shaped member; and
 a base member provided on the second surface side of the plate-shaped member and having a cooling function, wherein
 the first surface of the plate-shaped member is formed of the alumina-based sintered body in accordance with claim 2.

9. An electrostatic chuck at which a target object is retained, the electrostatic chuck comprising:
 a plate-shaped member having a first surface at which the target object is retained, a second surface opposite to the first surface, and a chuck electrode formed either at the second surface or inside the plate-shaped member; and
 a base member provided on the second surface side of the plate-shaped member and having a cooling function, wherein
 the first surface of the plate-shaped member is formed of the alumina-based sintered body in accordance with claim 3.

10. An alumina-based sintered body containing alumina (Al$_2$O$_3$) as a main component and containing magnesia (MgO) whose content with respect to a content of the alumina is 0.00 mol % <MgO≤0.20 mol %, wherein
 a density is 3.96 g/cm$^3$ or greater,
 a standard deviation of grain sizes of alumina crystal grains is smaller than 4.0 μm, and
 a dielectric breakdown voltage is 200 kV/mm or greater.

* * * * *